(12) United States Patent
Chen et al.

(10) Patent No.: US 10,470,330 B1
(45) Date of Patent: Nov. 5, 2019

(54) SERVER STRUCTURE HAVING DETACHABLE CARRIER

(71) Applicant: Super Micro Computer Inc., San Jose, CA (US)

(72) Inventors: Chieh-Tang Chen, San Jose, CA (US); William Shen, San Jose, CA (US)

(73) Assignee: SUPER MICRO COMPUTER INC., San Jose, CA (US)

( * ) Notice: Subject to any disclaimer, the term of this patent is extended or adjusted under 35 U.S.C. 154(b) by 0 days.

(21) Appl. No.: 16/184,826

(22) Filed: Nov. 8, 2018

(51) Int. Cl.
  *H05K 7/14* (2006.01)
  *G11B 33/02* (2006.01)

(52) U.S. Cl.
  CPC ......... *H05K 7/1487* (2013.01); *G11B 33/025* (2013.01); *H05K 7/1415* (2013.01)

(58) Field of Classification Search
  CPC ... H05K 7/1487; H05K 7/1415; G11B 33/025
  See application file for complete search history.

(56) References Cited

U.S. PATENT DOCUMENTS

| | | | | |
|---|---|---|---|---|
| 6,452,792 B1* | 9/2002 | Chen | ...................... | G06F 1/184 312/223.1 |
| 6,529,373 B1* | 3/2003 | Liao | ...................... | G06F 1/184 211/26 |
| 2005/0068721 A1* | 3/2005 | Chen | ...................... | G06F 1/184 361/679.32 |
| 2008/0123280 A1* | 5/2008 | Chen | ...................... | G06F 1/187 361/679.33 |
| 2009/0316342 A1* | 12/2009 | Li | ...................... | H04M 1/0254 361/679.01 |
| 2016/0018859 A1* | 1/2016 | Mao | ...................... | H05K 7/1487 361/679.58 |

* cited by examiner

*Primary Examiner* — Rockshana D Chowdhury
(74) *Attorney, Agent, or Firm* — Chun-Ming Shih; HDLS IPR Services

(57) ABSTRACT

A server structure includes a tray, a carrier and a releasing knob. The tray has an internal bottom surface, and a latch and a stopping arm are arranged thereon. The latch protrudes in the tray and parallel with the internal bottom surface. The stopping arm extends along the internal bottom surface and a stopping portion is defined thereon. The stopping portion protrudes from the internal bottom surface. The carrier for accommodating a hard disk drive is accommodated in the tray. A positioning pin for latching the hard disk drive protrudes in the carrier, a fixing hole is defined on the carrier, the latch is inserted in and latches the fixing hole, and the carrier is pressed by the stopping portion. The releasing knob is pivotally connected with the carrier and pressing the stopping arm and pivoting to press the stopping arm, and the stopping portion is thereby retracted.

11 Claims, 12 Drawing Sheets

SERVER STRUCTURE HAVING DETACHABLE CARRIER

BACKGROUND OF THE INVENTION

Technical Field

The present disclosure relates to a server, and more particularly to a server structure having a detachable carrier.

Description of Related Art

A conventional server is usually arranged in a rack, and a drawer tray is arranged therein for pushing the server into or pulling the server from the rack. Various components of the server are arranged in the tray. Generally, the server includes a mother board, hard disk drives and various expansion cards. Latch structures are usually arranged in the tray for fixing the hard disk drives. The existing latch structures are usually fixed in a conventional tray for a predetermined number of hard disk drives, and the arrangement is therefore not able to meet various requirements of usage.

In views of this, in order to solve the above disadvantage, the present inventor studied related technology and provided a reasonable and effective solution in the present disclosure.

SUMMARY OF THE INVENTION

A server structure having a detachable carrier is provided in the present disclosure.

A server structure for containing at least one hard disk drive is provided in the present disclosure. The server structure has a tray, a carrier and a releasing knob. The tray has an internal bottom surface, and a latch and a stopping arm are arranged on the tray. The latch is disposed in the tray, protruding and substantially extending parallel with the internal bottom surface. The stopping arm is disposed substantially extending along the internal bottom surface and a stopping portion is defined on the stopping arm. The stopping portion protrudes from the internal bottom surface. The carrier is accommodated in the tray and allowing a hard disk drive to be accommodated in the carrier. A positioning pin for latching a side of the hard disk drive is arranged protrudingly in the carrier, a fixing hole is defined on the carrier and corresponding to the latch, the latch is inserted in the fixing hole and latches an edge of the fixing hole, and the carrier is pressed by the stopping portion opposite to an extending direction of the latch. The releasing knob is pivotally connected with the carrier and pressing the stopping arm, the releasing knob pivots to press the stopping arm and the stopping portion is thereby retracted toward the internal bottom surface with bent stopping arm.

According to the server structure of the present disclosure, an arm latch for latching another side of the hard disk drive is arranged protrudingly in the carrier. The hard disk drive is clamped between the positioning pin and the arm latch. The positioning pin is arranged protrudingly on a side wall in the carrier. The arm latch is arranged protrudingly on another side wall in the carrier and opposite to the positioning pin. The positioning pin is arranged protrudingly on a side wall in the carrier.

According to the server structure of the present disclosure, an elastic resetting element for rotating the releasing knob to leave the stopping arm is arranged on the releasing knob. A notch is defined on the releasing knob, a limiting portion is arranged protrudingly on the carrier and accommodated in the notch, the releasing knob pivots to interfere the notch by the limiting portion, and a pivotal travel of the releasing knob is thereby defined. A first protrusion is arranged protrudingly on the carrier, a second protrusion is arranged protrudingly on the releasing knob, and the first protrusion and the second protrusion are moved relatively to each other and meanwhile contacted with each other when the releasing knob is pivoted and a pivotal travel of the releasing knob is thereby defined.

According to the server structure of the present disclosure, a sliding pin is arranged on the tray, the sliding pin is arranged protrudingly on the internal bottom surface, and a sliding slot for coupling with the sliding pin is defined on the carrier. At least one edge of the sliding slot is extended parallel with an extending direction of the latch, and the sliding pin is contacted with the edge when moving.

According to the server structure of the present disclosure, a couple of steps separated from each other are formed in the carrier. A positioning screw is arranged on the internal bottom surface of the carrier and the positioning screw is disposed between the couple of steps.

The server structure of the present disclosure has at least one detachable carrier and the carriers could be selectively disposed according to required number and type of the element in the tray.

BRIEF DESCRIPTION OF DRAWING

The present disclosure can be more fully understood by reading the following detailed description of the embodiment, with reference made to the accompanying drawings as follows.

DETAILED DESCRIPTION OF THE INVENTION

Figure 1:
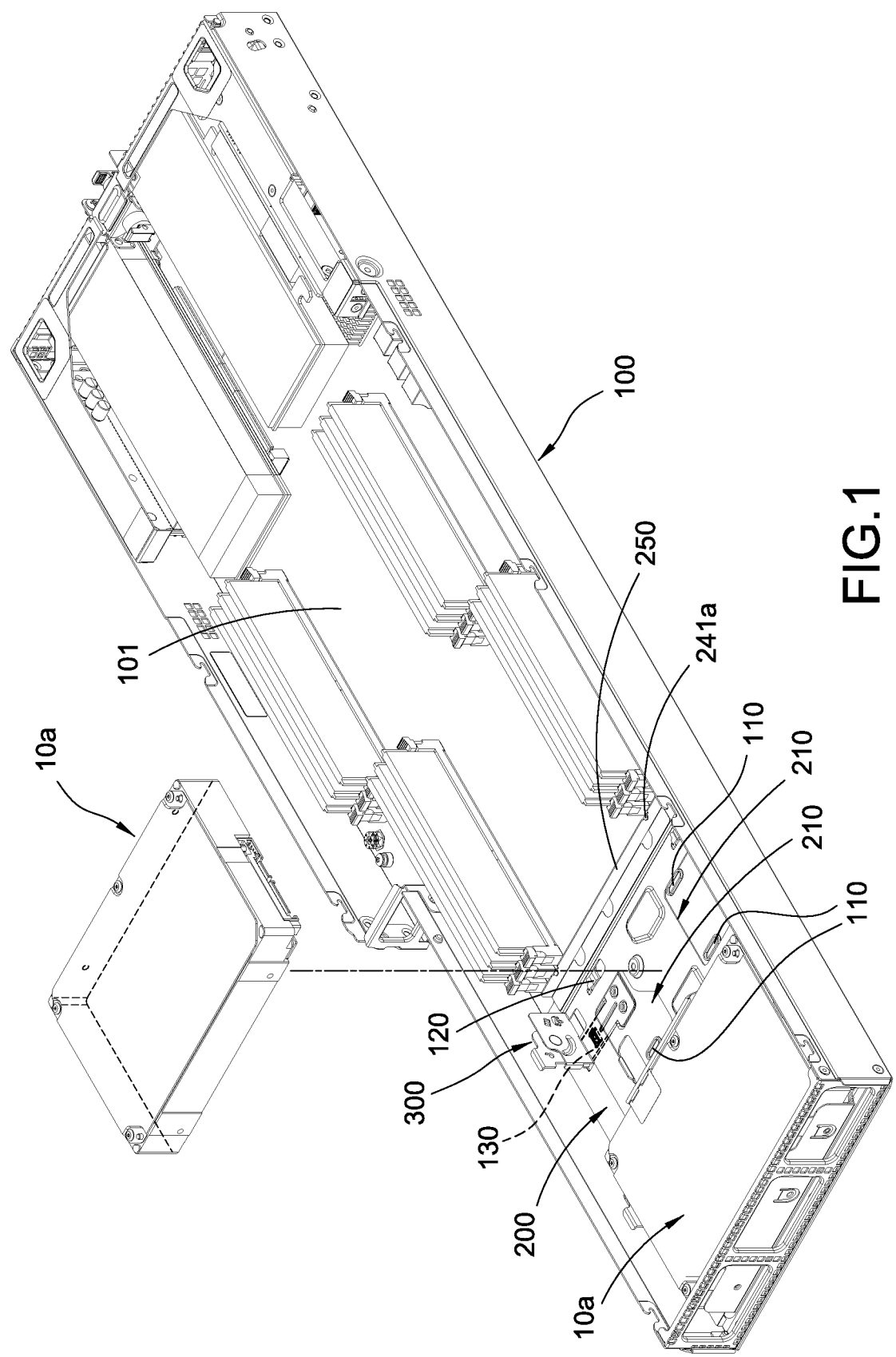
FIGS. 1 to 3 are perspective views of showing the server structure according to an embodiment of the present disclosure.

According to FIGS. 1 to 4, a server structure for containing at least one hard disk drive 10a is provided in the present disclosure. According to the present embodiment, the server structure of the present disclosure preferably has a tray 100, a carrier 200 and a releasing knob 300.

According to the present embodiment, the tray 100 is preferably a drawer-shaped metal case. An internal bottom surface 101 is defined in the tray 100, and at least one latch 120 for fixing the carrier 200 and a corresponding stopping arm 130 is arranged on the tray 100. According to the present embodiment, two groups of same latches 120 are preferably arranged in the tray 100, each group of latches 120 has four same latches 120, and a stopping arm 130 is arranged corresponding to each group of latches 120. The construction of the respective latches 120 will be described later by taking only one of the latches 120 as an example.

The latch 120 is arranged protrudingly in the tray 100 and extended substantially parallel with the internal bottom surface 101 of the tray 100, and the respectively latches 120 of each group thereof are extended toward the same direction. According to the present embodiment, the latch 120 is formed protrudingly on the internal bottom surface 101 of the tray 100 by punching and arranged separated from the internal bottom surface 101. The stopping arm 130 is extended substantially along the internal bottom surface 101 of the tray 100. According to the present embodiment, one end of the stopping arm 130 is riveted on the internal bottom surface 101 of the tray 100, a stopping portion 131 is formed on the stopping arm 130, and the stopping portion 131 is arranged protrudingly on the internal bottom surface 101 of the tray 100. At least one sliding pin 110 for guiding the carrier 200 to be installed is additionally arranged on the tray 100, the sliding pin 110 is arranged protrudingly on the internal bottom surface 101 of the tray 100, and an extending direction of the sliding pin 110 is preferably parallel with an extending direction of the latch 120. The number of the sliding pins 110 is not limited in the present disclosure, and additional sliding pins 110 could be added according to requirements of usage. According to the present embodiment, a plurality of sliding pins 110 are preferably arranged on the internal bottom surface 101 of the tray 100.

The carrier 200 is accommodated in the tray 100, and the aforementioned hard disk drive 10a is accommodated in the carrier 200. The number of the carriers 200 is not limited in the present disclosure, and additional carriers 200 could be added according to requirements of usage. According to the present embodiment, two hard disk drives 10a are preferably arranged in the server structure of the present disclosure, and two same carriers 200 are therefore preferably arranged in the tray 100. The construction of the respective carriers 200 will be described later by taking only one of the carriers 200 as an example.

The carrier 200 is preferably a flat metal case with an opened top and the hard disk drives 10a are allowed to accommodate therein. A positioning pin 241a for latching a sided of the hard disk drive 10a is arranged protrudingly in the carrier 200 and a fixing hole 201 is defined carrier 200 on the carrier 200 corresponding to aforementioned each latch 120. A pair of steps 250 spaced from each other is formed in the carrier 200.

Figure 2:
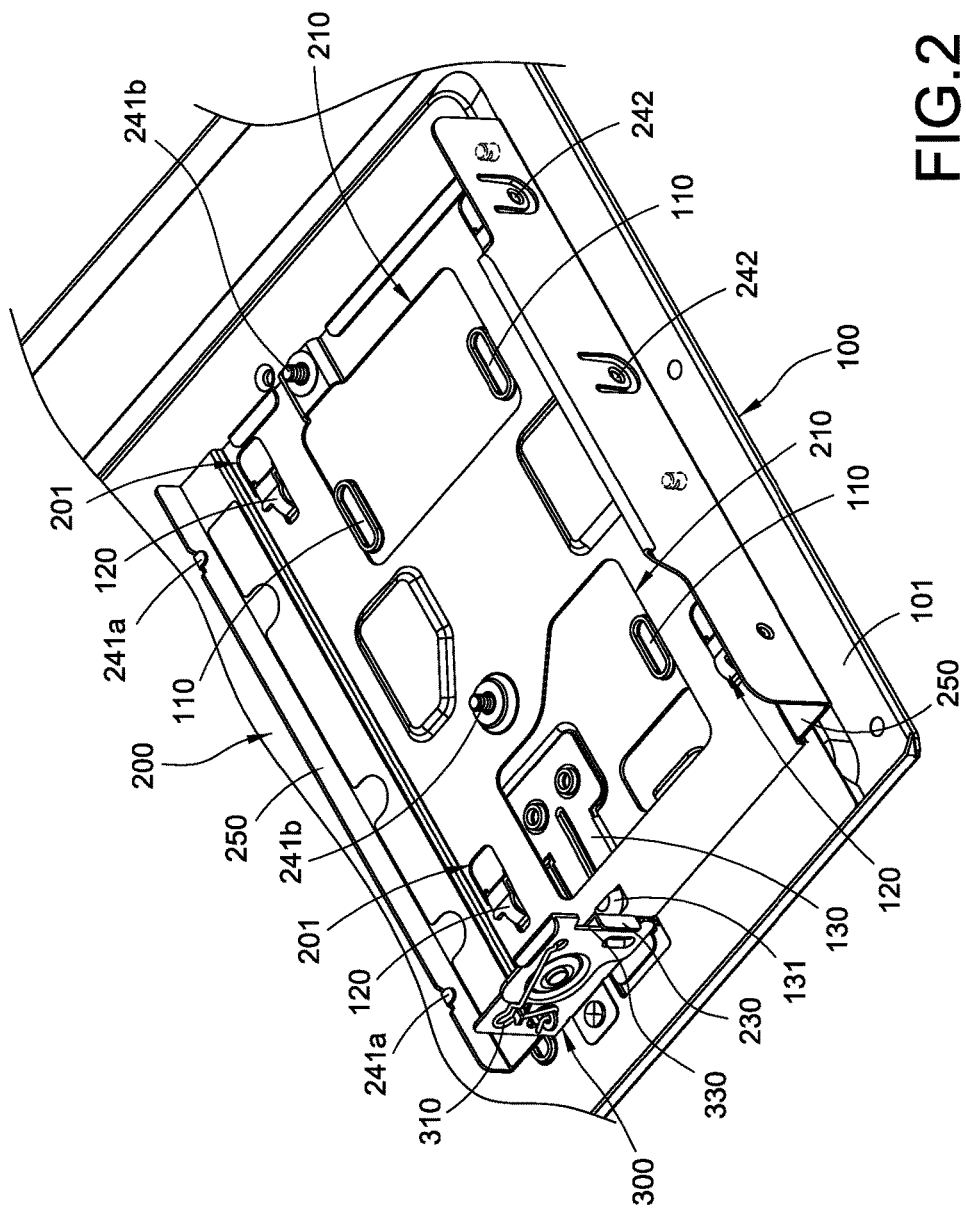
Figure 5:
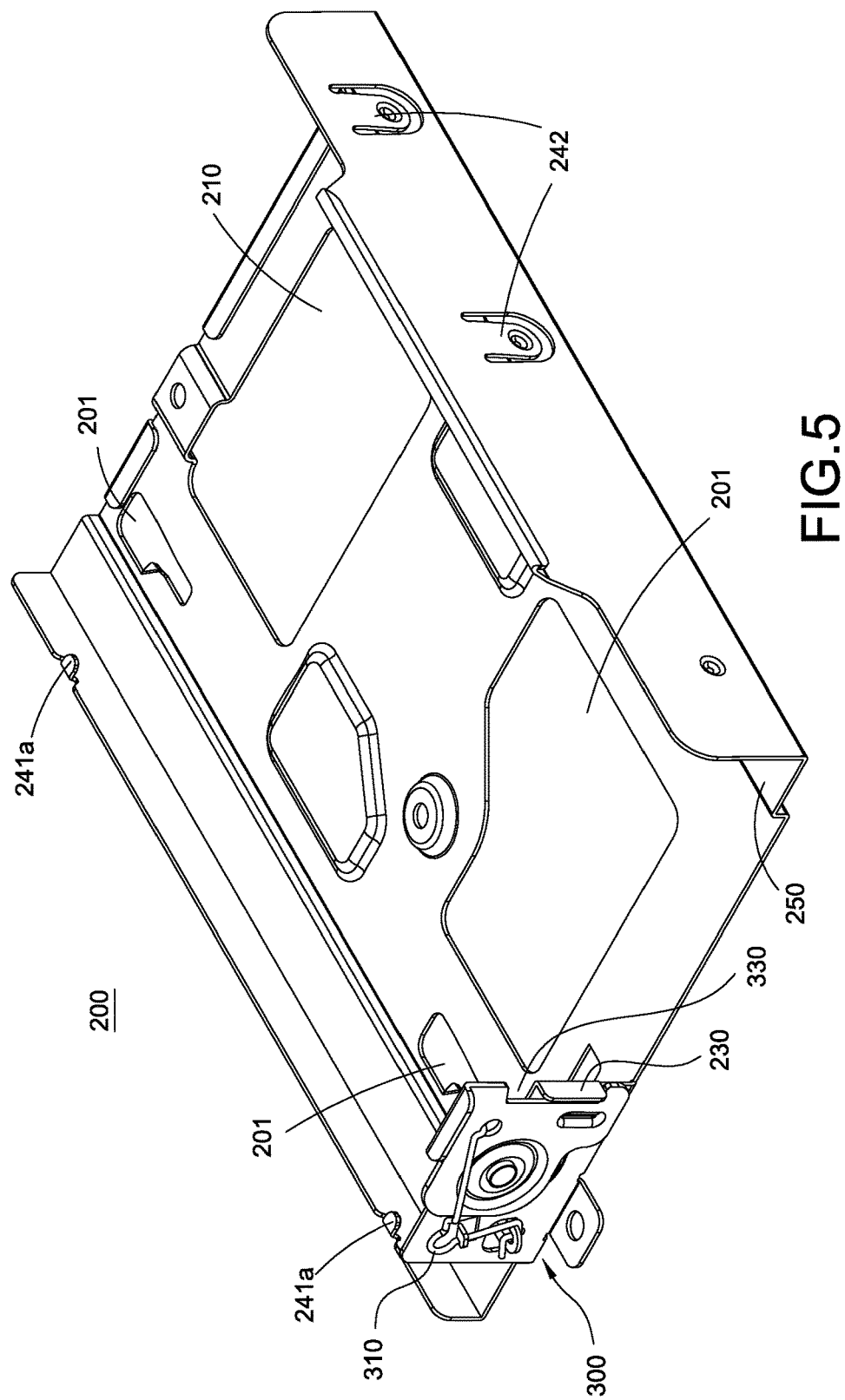
FIG. 5 is a perspective view of showing the carrier of the server structure according to the embodiment of the present disclosure.
Figure 6:
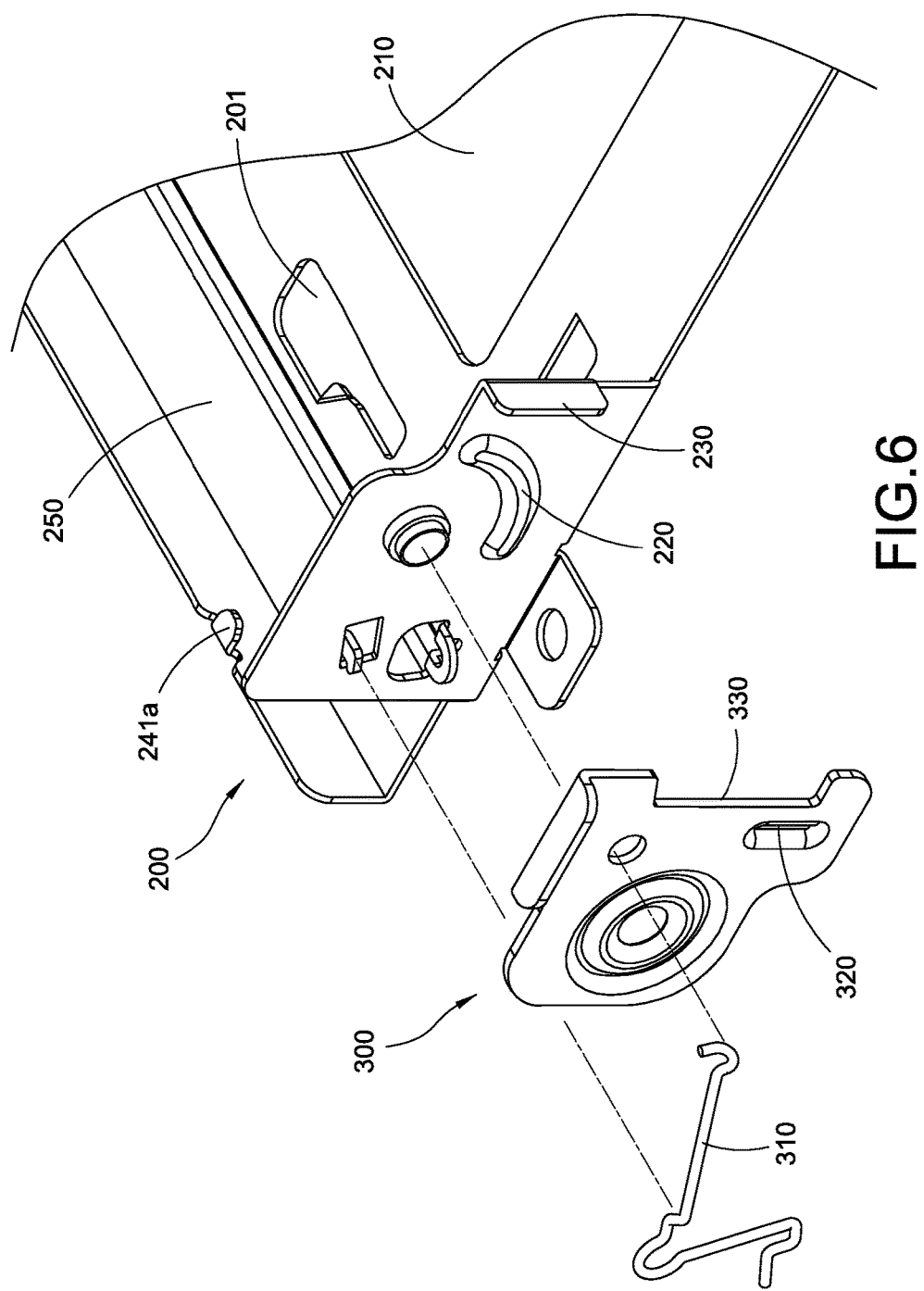
FIG. 6 is an exploded view of showing the carrier and the releasing knob of the server structure according to the embodiment of the present disclosure.

According to FIGS. 2, 5 and 6, the releasing knob 300 is pivotally connected with the carrier 200 and pressing the stopping arm 130. According to the present embodiment, the releasing knob 300 is preferably configured upright and pivotally connected with a side of the carrier 200, and the releasing knob 300 thereby could swing up and down. An elastic resetting element 310 for rotating the releasing knob 300 to leave the stopping arm 130 is arranged on the releasing knob 300. A notch 330 is defined on the releasing knob 300, a limiting portion 230 accommodated in the notch 330 is arranged protrudingly in the carrier 200, and the releasing knob 300 is allowed to pivoted to which the notch 330 is interfered by the limiting portion 230 and a pivoting travel of the releasing knob 300 is thereby limited. According to FIGS. 6 and 10, a first protrusion 220 is arranged protruding on the carrier 200, a second protrusion 320 is arranged protrudingly on the releasing knob 300, and the first protrusion 220 and the second protrusion 320 are moved relatively each other and meanwhile contacted with each other when the releasing knob 300 is pivoted. Thereby, a pivotal travel of the releasing knob 300 is defined.

Figure 3:
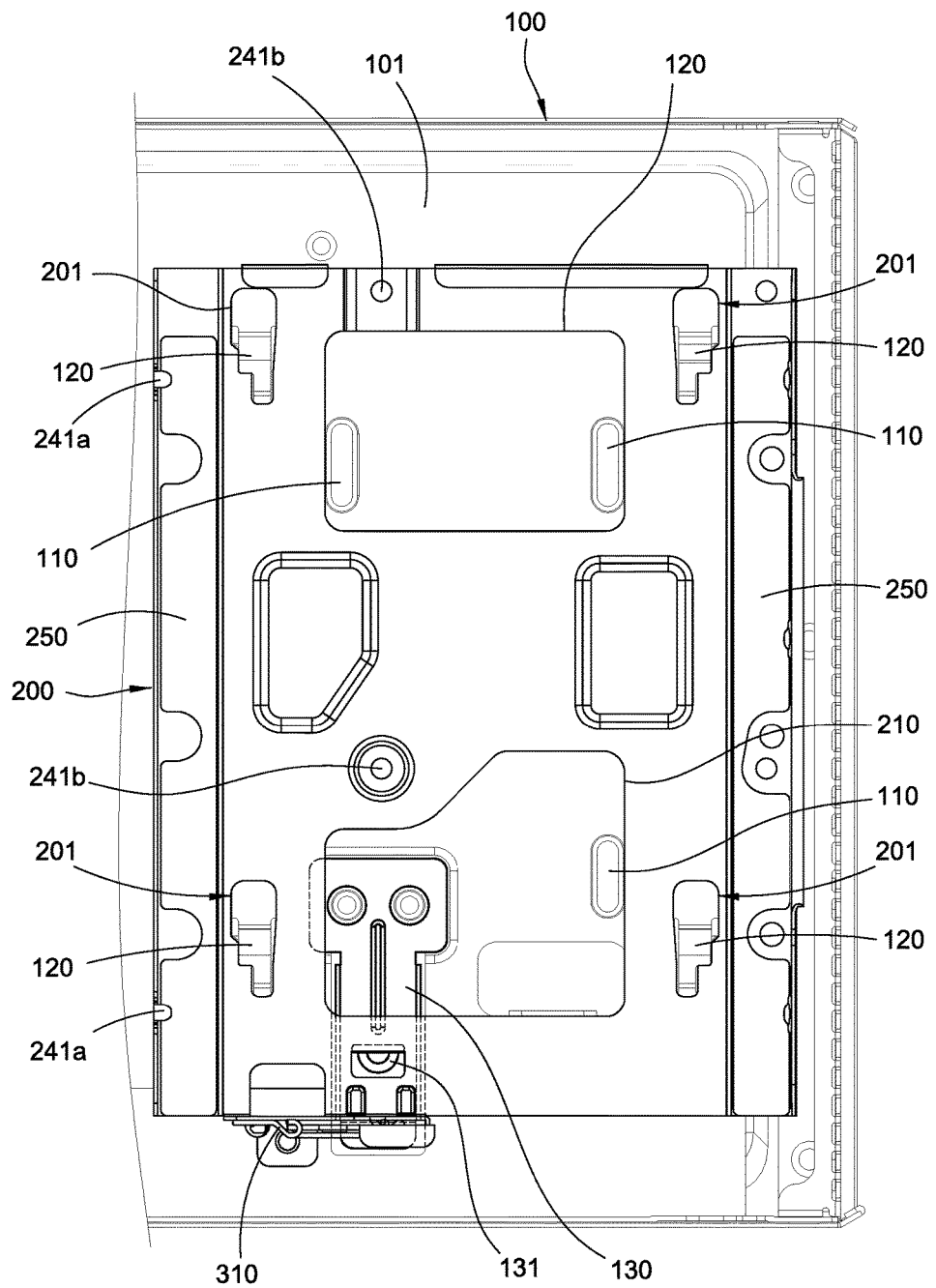
Figure 4:
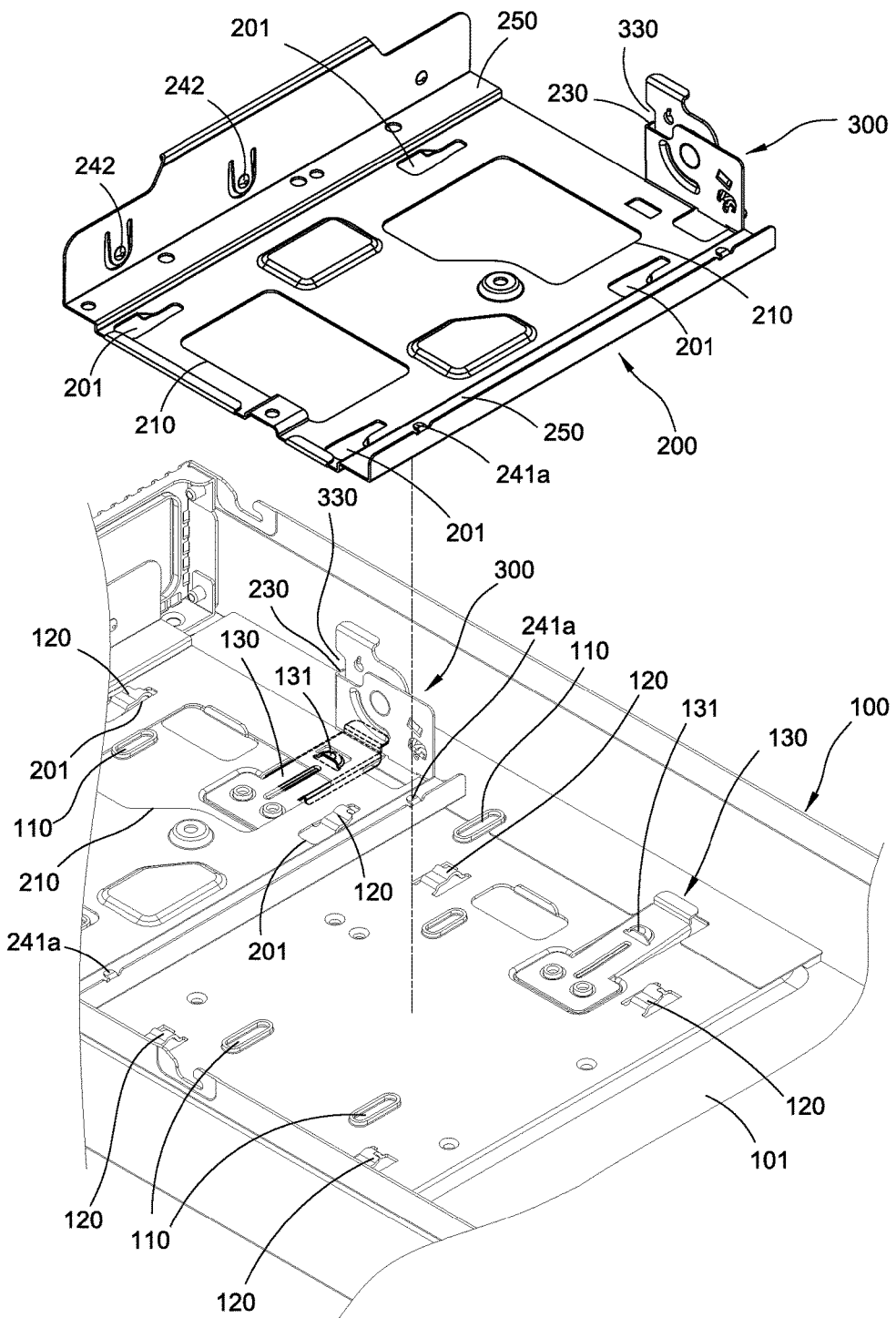
FIG. 4 is an exploded view of showing the server structure according to the embodiment of the present disclosure.

According to FIGS. 2 to 4, when the carrier 200 is installed into the tray 100, the carrier 200 is firstly placed on the internal bottom surface 101 of the tray 100 and the respective latches 120 are respectively inserted in the corresponding respective fixing holes 201. Then, the carrier 200 is pressed down to press the stopping arm 130 by a bottom of the carrier 200, and the stopping portion 131 is retracted toward the internal bottom surface 101 with bent stopping arm 130. The carrier 200 is laterally moved along an extending direction of each latch 120 toward a root of each latch 120, and so that the respective latches 120 are latched with edges of the corresponding respective fixing holes 201. Thereby, the carrier 200 is fixed, and the carrier 200 is not able to upward detach the tray 100. A sliding slot 210 for coupling with the sliding pin 110 is defined on the carrier 200, at least one edge of the sliding slot 210 is extended parallel with an extending direction of the latches 120, and the sliding pin 110 presses the edge of the sliding slot 210 when sliding. The stopping portion 131 of the stopping arm 130 presses the carrier 200 opposite to the extending direction of the latch 120. Thereby, the carrier 200 is prevented from a lateral movement and the latch 120 is prevented from detaching from the fixing hole 201.

Figure 7:
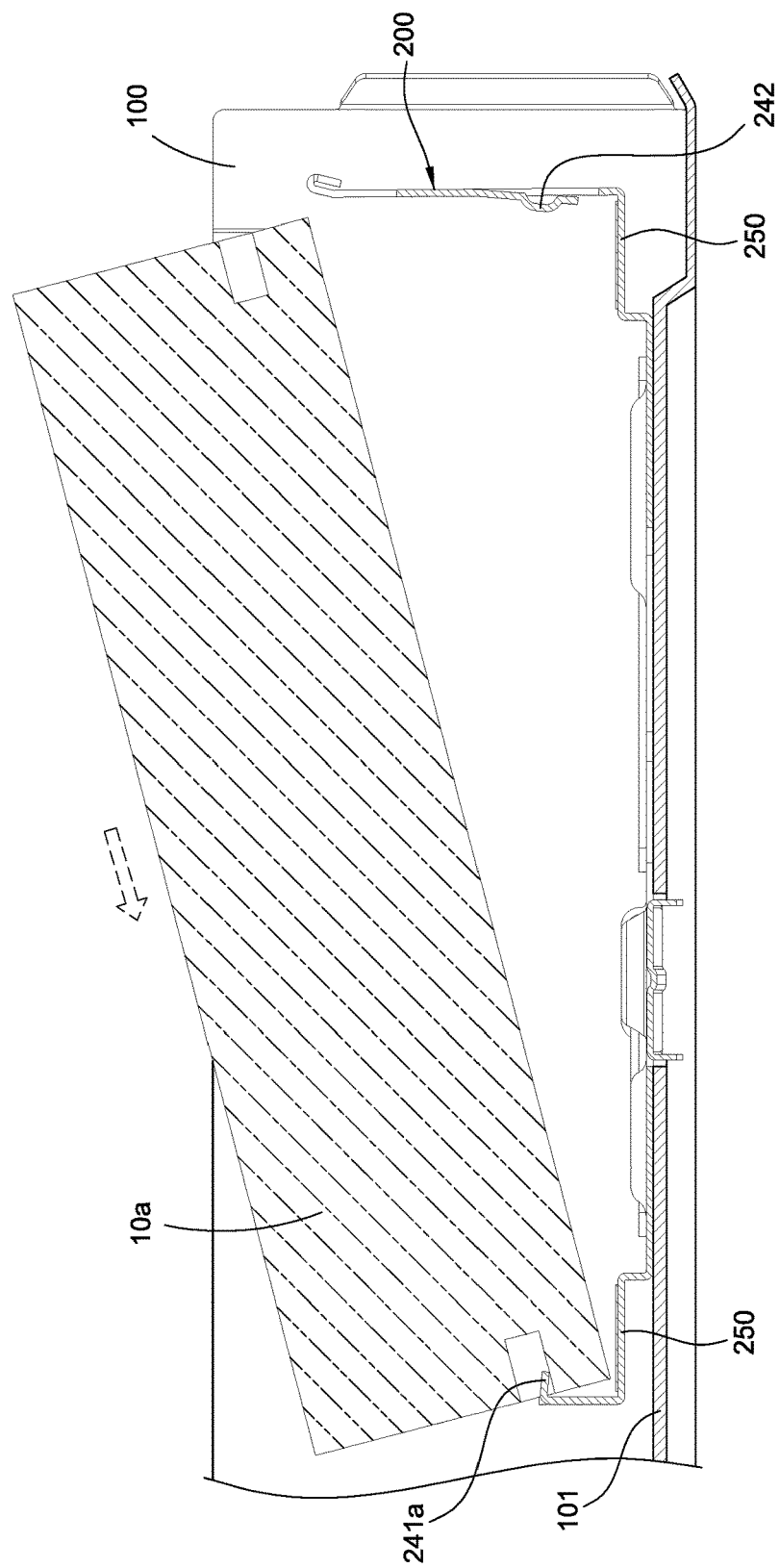
FIGS. 7 and 8 are perspective views of showing a hard disk drive that is installed into the server structure according to the embodiment of the present disclosure.
Figure 8:
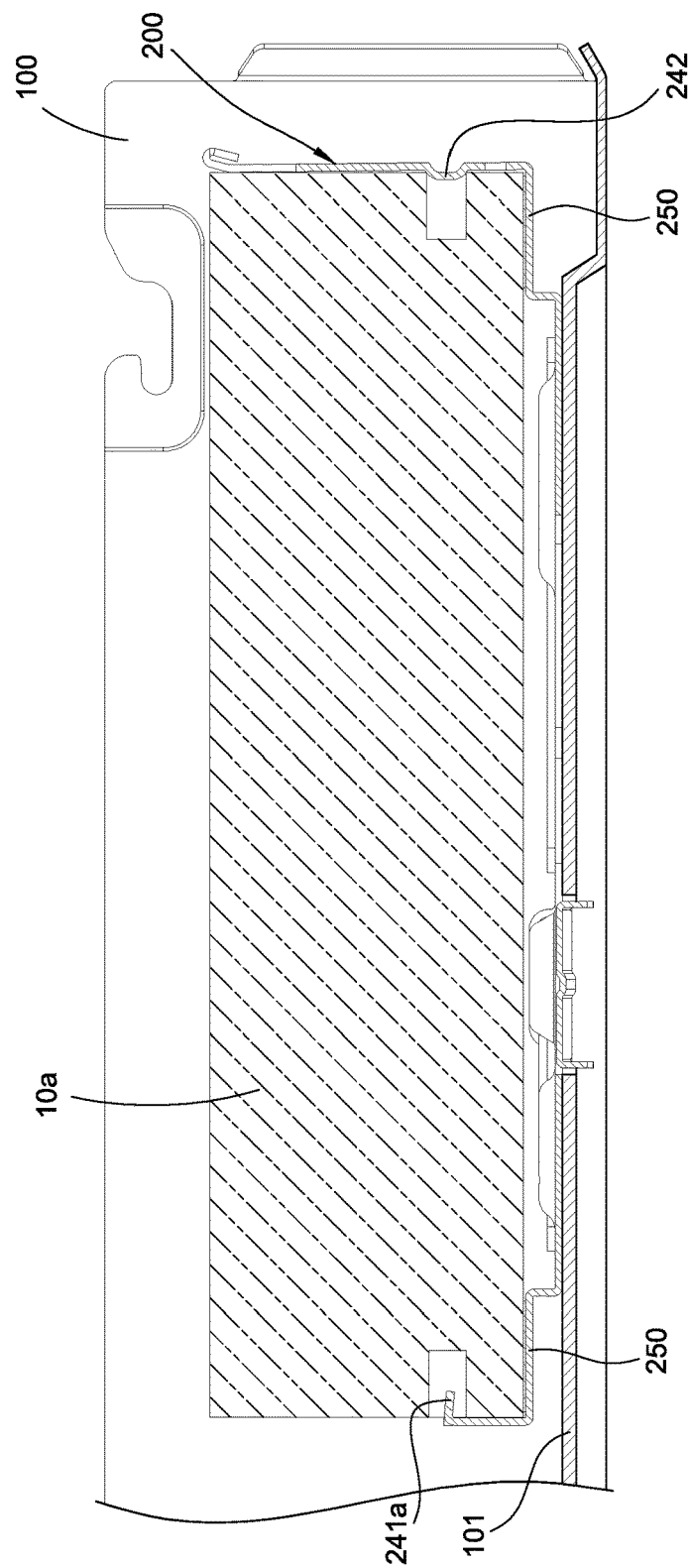

According to FIGS. 7 and 8, a 3.5-inch hard disk drive 10a fixed in the carrier 200 is described in detail as followed. The positioning pin 241a could be arranged protrudingly on a side wall in the carrier 200, at least one arm latch 242 for latching another side of the 3.5-inch hard disk drive 10a is arranged protrudingly in the carrier 200, and the arm latch 242 is arranged on another side wall on the carrier 200 and opposite to the positioning pin 241a. The number of the arm latches 242 is not limited in the present disclosure, according to the present embodiment, a couple of same arm latches 242 are arranged protrudingly in the carrier 200. According to FIG. 7, a side of the 3.5-inch hard disk drive 10a is obliquely inserted into the carrier 200 and this side of the hard disk drive 10a is latched by the positioning pin 241a. According to FIG. 8, another side of the 3.5-inch hard disk drive 10a is pressed into the carrier 200 and latched by the arm latch 242, and the 3.5-inch hard disk drive 10a is thereby clamped between the positioning pin 241a and the arm latch 242 located on a top of the step 250.

Figure 9:
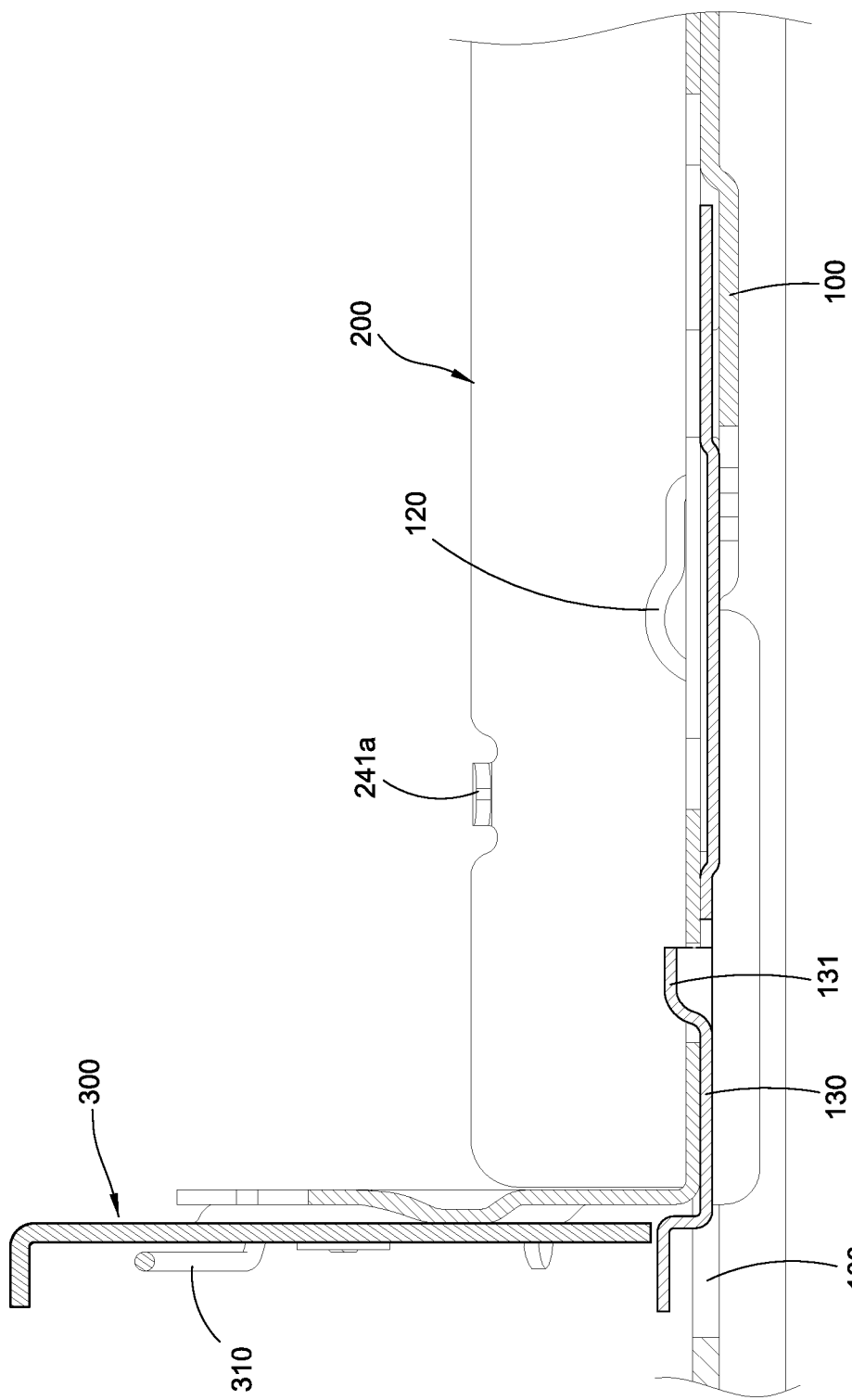
FIGS. 9 to 11 are perspective views of showing a hard disk drive that is detached from the server structure according to the embodiment of the present disclosure.
Figure 10:
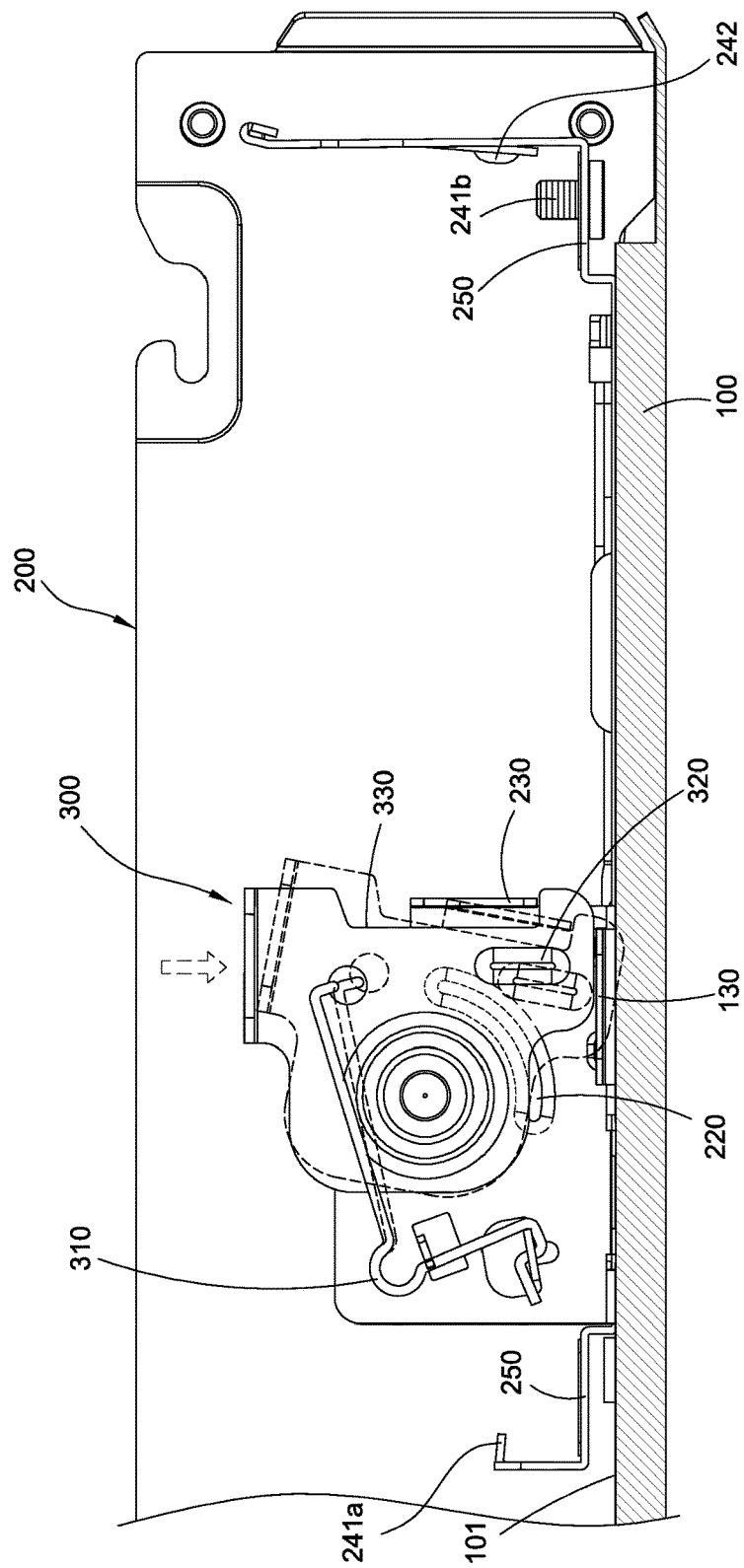
Figure 11:
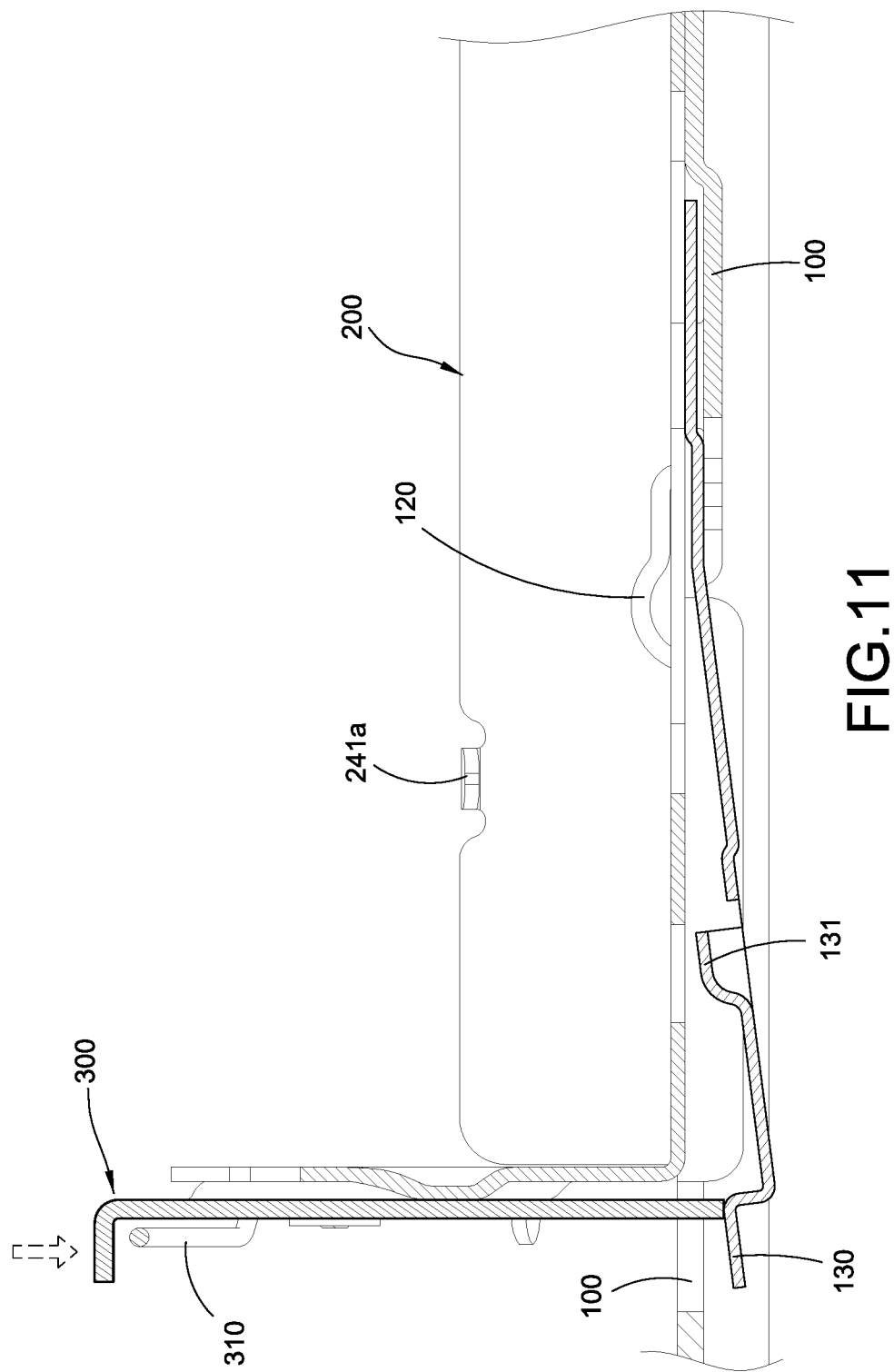

According to FIGS. 9 to 11, when the tray 100 is detached from the carrier 200, a user presses the releasing knob 300 down, the releasing knob 300 is thereby pivoted down to press the stopping arm 130, and the stopping arm 130 is thereby elastically bent down. Thereby, the stopping portion 131 of the stopping arm 130 is retracted toward the internal bottom surface 101 of the tray 100 with bent stopping arm 130. When the stopping portion 131 of the stopping arm 130 is retracted to be entirely covered by the internal bottom surface 101 of the tray 100, the carrier 200 could be laterally moved on the internal bottom surface 101 of the tray 100 along the extending direction of the latch 120 and the respective latches 120 are thereby released from hole edges of the respective latched fixing holes 201. The carrier 200 could be further moved upward and the respective latches 120 are thereby released from the respective fixing holes 201. Accordingly, the carrier 200 could be detached from the tray 100.

Figure 12:
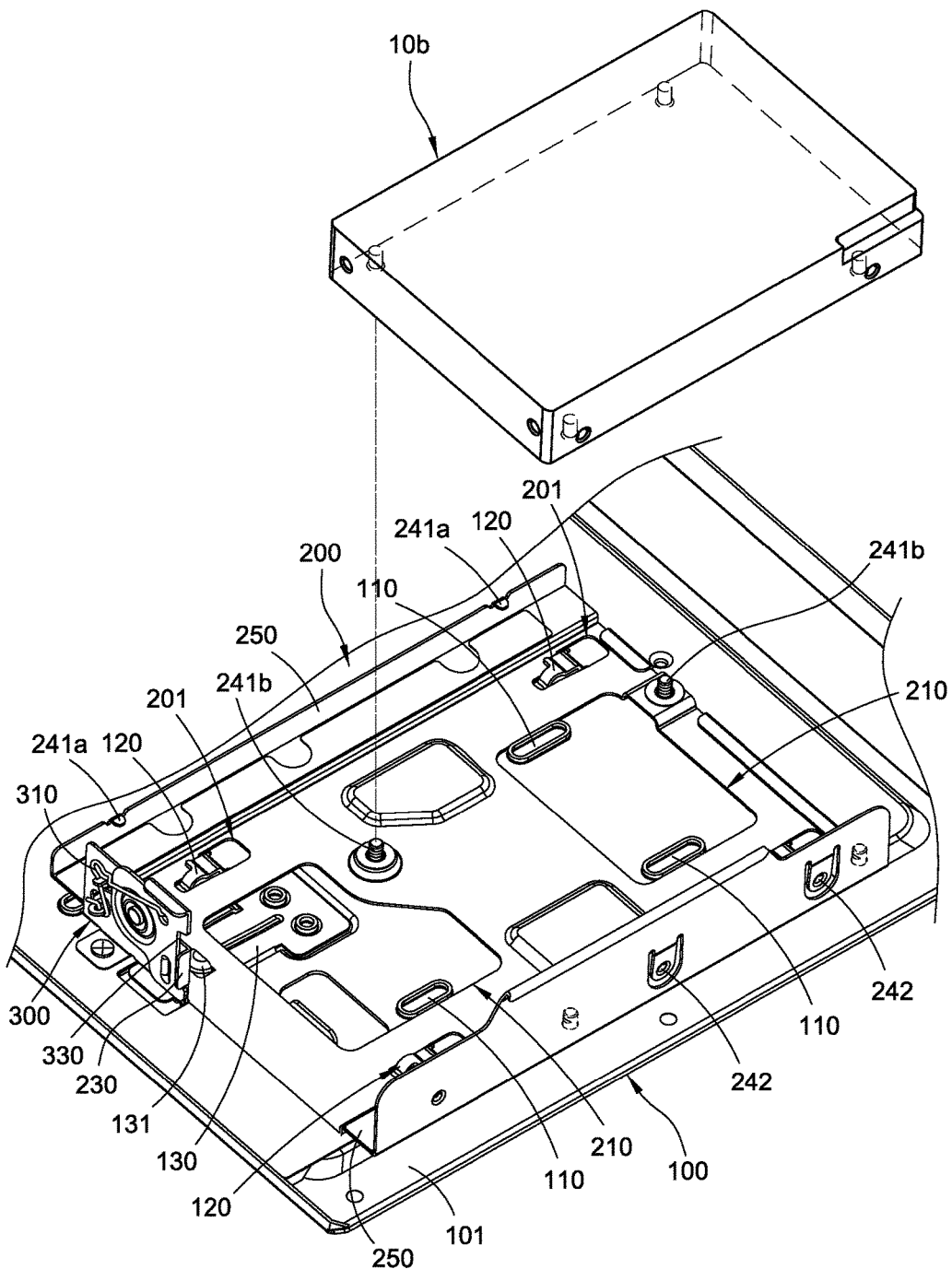
FIG. 12 is a perspective view of showing another hard disk drive that is installed in the server structure according to the embodiment of the present disclosure.

According to FIG. 12, a positioning screw 241b could be arranged protrudingly on the internal bottom surface 101 of the carrier 200, and the positioning screw 241b is disposed between the couple of steps 250. A 2.5-inch hard disk drive 10b is disposed between the couple of steps 250, and the 2.5-inch hard disk drive 10b is screw fixed in the carrier 200 by the positioning screw 241b.

The server structure of the present disclosure has at least one detachable carrier 200 and the carriers 200 could be selectively disposed according to the required number and type of the elements in the tray 100.

Although the present disclosure has been described with reference to the foregoing preferred embodiment, it will be understood that the disclosure is not limited to the details thereof. Various equivalent variations and modifications can still occur to those skilled in this art in view of the teachings of the present disclosure. Thus, all such variations and equivalent modifications are also embraced within the scope of the present disclosure as defined in the appended claims.

What is claimed is:

1. A server structure for carrying at least one hard disk drive, the server structure comprising:

a tray comprising an internal bottom surface therein, and a latch and a stopping arm being arranged on the tray, the latch being disposed protrudingly in the tray and substantially extending parallel with the internal bottom surface, the stopping arm being disposed substantially extending along the internal bottom surface and a stopping portion being defined on the stopping arm, the stopping portion being disposed protrudingly from the internal bottom surface;

a carrier accommodated in the tray and the hard disk drive be accommodated in the carrier, a positioning pin for latching a side of the hard disk drive being arranged protrudingly in the carrier, a fixing hole being defined on the carrier and corresponding to the latch, the latch being inserted in the fixing hole and latching an edge of the fixing hole, the carrier being pressed by the stopping portion opposite to an extending direction of the latch; and a releasing knob pivotally connected with the carrier and pressing the stopping arm, the releasing knob pivoting to press the stopping arm and the stopping portion being thereby retracted toward the internal bottom surface with bent stopping arm;

wherein when the stopping portion of the stopping arm is retracted to be entirely covered by the internal bottom surface of the tray, the carrier laterally moved on the internal bottom surface of the tray along the extending direction of the latch and the latch thereby released from hole edges of the fixing hole;

wherein the carrier further moved upward and the latch thereby released from the fixing hole, and the carrier detached from the tray;

wherein a notch is defined on the releasing knob, a limiting portion is arranged protrudingly on the carrier and accommodated in the notch, the releasing knob pivots to interfere the notch by the limiting portion, and a pivotal travel of the releasing knob is thereby defined.

2. The server structure according to claim 1, wherein an arm latch for latching another side of the hard disk drive is arranged protrudingly in the carrier.

3. The server structure according to claim 2, wherein the hard disk drive is clamped between the positioning pin and the arm latch.

4. The server structure according to claim 2, wherein the positioning pin is arranged protrudingly on a side wall in the carrier, and the arm latch is arranged protrudingly on another side wall in the carrier and opposite to the positioning pin.

5. The server structure according to claim 1, wherein the positioning pin is arranged protrudingly on a side wall in the carrier.

6. The server structure according to claim 1, wherein an elastic resetting element for rotating the releasing knob to leave the stopping arm is arranged on the releasing knob.

7. The server structure according to claim 1, wherein a first protrusion is arranged protrudingly on the carrier, a second protrusion is arranged protrudingly on the releasing knob, and the first protrusion and the second protrusion are moved relatively to each other and contacted with each other when the releasing knob is pivoted and a pivotal travel of the releasing knob is thereby defined.

8. The server structure according to claim 1, wherein a sliding pin is arranged on the tray, the sliding pin is arranged protrudingly on the internal bottom surface, and a sliding slot for coupling with the sliding pin is defined on the carrier.

9. The server structure according to claim 8, wherein at least one edge of the sliding slot is extended parallel with an extending direction of the latch, and the sliding pin is contacted with the edge when moving.

10. The server structure according to claim 1, wherein a couple of steps separated from each other are formed in the carrier.

11. The server structure according to claim 10, wherein a positioning screw is arranged on an internal bottom surface of the carrier and the positioning screw is disposed between the couple of steps.

* * * * *